US006816821B1

United States Patent
Barrett

(10) Patent No.: US 6,816,821 B1
(45) Date of Patent: Nov. 9, 2004

(54) POST IMAGE TECHNIQUES

(75) Inventor: Geoff Barrett, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/477,790

(22) Filed: Dec. 31, 1999

Related U.S. Application Data

(63) Continuation-in-part of application No. 09/028,415, filed on Feb. 24, 1998, now Pat. No. 6,031,983.

(30) Foreign Application Priority Data

Sep. 3, 1997 (GB) ............................................. 9718688

(51) Int. Cl.[7] .............................................. G06F 17/10
(52) U.S. Cl. ................................ 703/2; 703/6; 703/13; 703/23; 700/12; 714/37; 714/724
(58) Field of Search ......................... 703/2, 6, 13, 23; 700/12; 714/37, 724

(56) References Cited

U.S. PATENT DOCUMENTS

| | | | |
|---|---|---|---|
| 4,200,770 A | | 4/1980 | Hellman et al. |
| 4,376,299 A | | 3/1983 | Rivest |
| 5,258,919 A | | 11/1993 | Yamanouchi et al. |
| 5,272,755 A | | 12/1993 | Miyaji et al. |
| 5,311,521 A | | 5/1994 | Fitingof et al. |
| 5,325,433 A | | 6/1994 | Torii et al. |
| 5,327,544 A | | 7/1994 | Lee et al. |
| 5,331,568 A | | 7/1994 | Pixley |
| 5,475,388 A | | 12/1995 | Gormish et al. |
| 5,491,639 A | * | 2/1996 | Filkorn ............................. 716/5 |
| 5,615,137 A | | 3/1997 | Holzmann et al. |
| 5,625,692 A | | 4/1997 | Herzberg et al. |
| 5,706,473 A | | 1/1998 | Yu et al. |
| 5,831,853 A | | 11/1998 | Bobrow et al. |
| 6,134,512 A | * | 10/2000 | Barrett ........................... 703/13 |

FOREIGN PATENT DOCUMENTS

EP          0 653 716 A1     5/1995

OTHER PUBLICATIONS

Pixley et al., "Exact Calculation of Synchronizing Sequences Based on Binary Decision Diagrams", IEEE Transcations on Computer–Aided Design of Integrated Circuits and Systems, Aug. 1994, pp. 1024–1034.*

Cabodi et al., "Symbolic Exploration of Large Circuits with Enhanced Forward / Backward Traversals", Proceedings of the Conference on European Design Automation Conference, 1994, pp. 22–27.*

Iwashita et al., "CTL Model Checking Based on Forward State Traversal", Proceedings of the 1996 IEEE/ACM International Conference on Computer–Aided Design, Nov. 1996, pp. 82–87.*

(List continued on next page.)

Primary Examiner—Kevin J. Teska
Assistant Examiner—Herng-der Day
(74) Attorney, Agent, or Firm—Lisa K. Jorgenson; James H. Morris; Wolf, Greenfield & Sacks, P.C.

(57) ABSTRACT

A device for synthesizing a reverse model of a system includes a first store storing bits representative of transition functions of the system, a second store storing bits representative of an estimate of transition functions of the reverse model, and processing system. The processing system comprises a logical device for transforming the transition functions of the system into constraints on the reverse model, and a parameterization processor for applying a parameterization of the constraints to the estimate of transition functions of reverse system to form transition functions of the

17 Claims, 2 Drawing Sheets

OTHER PUBLICATIONS

Peng et al., *Reachability and Reverse Reachability Analysis of CFSMs,* Computer Communications, vol. 19, No. 8, Jul. 1996, pp. 668–674.

Takahara et al., *A Higher Level Hardware Design Verification,* Proceedings of the 1988 IEEE International Conference on Computer Design: VLSI in Computers and Processors, Rye, New York, Oct. 3–5, 1988, pp. 596–599.

Jain et al., *Hierarchical Constraint Solving in the Parametric Form with Applications to Efficient Symbolic Simulation Based Verification,* Proceedings of the 1993 IEEE International Conference on Computer Design: VLSI in Computers and Processors, Cambridge, Massachusetts, Oct. 3–6, 1993, pp. 304–307.

Aziz et al., *Minimizing Interacting Finite State Machines: A Compositional Approach to Language Containment,* Oct. 10–12, 1994, pp. 255–261, IEEEE XP000488900.

Coudert et al., *Verification of Sequential Machines Using Boolean Functional Vectors,* Dec. 13, 1989, Int. Workshop on Applied Formal Methods for Correct VLSI Design.

Vai et al., *Qualitatively Modeling Heterojunction Bipolar Transistors For Optimization: A Neural Network Approach,* IEEE/Cornell Conference on Advanced Concepts in High Speed Semiconductor Devices and Circuits, 1993, pp. 219–227.

Wu et al., *A Massively Parallel Reverse Modeling Approach For Semiconductor Devices And Circuits,* IEEE/Cornell Conf. On Advanced Concepts in High Speed Semiconductor Devices and Circuits, 1997, pp. 201–209.

Vai et al., *Reverse Modeling Of Microwave Circuits With Bidirectional Neural Network Models,* IEEE Transactions on Microwave Theory and Techniques, vol. 46, No. 10, Oct. 1998, pp. 1492–1494.

Standard Search Report issued by the European Patent Office, dated Nov. 11, 1997.

Hu et al., *New Techniques For Efficient Verification With Implicity Conjoined BDDs,* Proceedings of the IEEE Design Automation Conference, San Diego, California, Jun. 6–10, 1994, pp. 276–282.

* cited by examiner

POST IMAGE TECHNIQUES

This application is a-continuation-in-part of U.S. patent application Ser. No. 09/028,415, filed Feb. 24, 1998 now U.S. Pat. No. 6,031,983, entitled Post-image Techniques.

FIELD OF THE INVENTION

The present invention relates to a technique for deriving properties of a control system, and more especially to a technique for deriving properties of a hardware system using a model of the system.

DESCRIPTION OF THE PRIOR ART

When seeking to derive the properties of a system on the basis of known transition functions of the system and all of the possible starting states, it is known to use so-called "post-image" techniques to derive the reachable states of the system. A known set of initial states is selected and the post-image of that initial set is formed to provide a first reachable set. The first reachable set is compared to the known set of reachable states and, if the known set does not comprise the first reachable set, a new set of known reachable states is formed comprising the combination of the set of reachable states and the first reachable set. If however the known set of reachable states comprises the first reachable set, the set of reachable states is determined to be an invariant of the system, and computation ceases.

Where the system model is a set of transition functions, it would be considerably more efficient to produce the so-called "pre-image" of a set of states than it would be to produce the post-image. In simple terms, where each of several inputs to a system causes one of a set of outputs, a worst case for testing which input provided one particular output of interest would require all of the inputs to be applied in turn before it was possible to identify the input that gave rise to the particular output.

SUMMARY OF THE INVENTION

According to one aspect, the present invention derives transition functions for a reverse machine, i.e., a machine such that the post-image of the reverse machine will be the pre-image of the original system. The described novel technique has a large number of applications such as deriving properties of a control system using a model of the system, or deriving properties of a hardware system using a model of the system. The described novel technique may specifically be used for testing electronic circuits, testing logic circuits, including microprocessors.

According to another aspect, a method of calculating the post-image in a system includes forming a reverse model of the system, and calculating the pre-image in the reverse model, wherein the pre-image in the reverse model is equivalent to the post-image in the system. Preferably, the reverse model may be formed without knowing input states and the corresponding outputs states of the system. The formation of the reverse model may include transforming a transition function of the system into a constraint on the reverse model, and applying a parameterization of the constraint to all transitions of the reverse model.

According to yet another aspect, a method of synthesizing a reverse model of a system includes transforming a transition function of the system into a constraint on the reverse model, and applying a parameterization of the constraint to all transitions of the reverse model.

According to yet another aspect, a device for synthesizing a reverse model of a system includes a first store (a first memory), a second store (a second memory), and a processing system. The first store is constructed and arranged to store bits representative of transition functions of the system. The second store is constructed and arranged to store bits representative of an estimate of transition functions of the reverse model. The processing system includes logical device and a parameterization processor. The logical device is constructed and arranged to transform the transition functions of the system into constraints on the reverse model. The parameterization processor is arranged to apply a parameterization of the constraints to the estimate of transition functions of the reverse system to form transition functions of the reverse model.

According to yet another aspect, a device for synthesizing a reverse model of a system includes a first means for storing bits representative of transition functions of the system; a second means storing bits representative of an estimate of transition functions of the reverse model; and processing means. The processing means include a logical means for transforming the transition functions of the system into constraints on the reverse model; and a parameterization means for applying a parameterization of the constraints to the estimate of transition functions of the reverse system to form transition functions of the reverse model.

According to yet another aspect, a device for calculating the post-image in a system includes a third store (a third memory), a fourth store (a fourth memory), and a logical device. The third store is constructed and arranged to store bits representative of transition functions of a reverse model of the system. The fourth store is constructed and arranged to store bits representative of a set of states of the system. The logical device is constructed and arranged to substitute the state variables of the reverse model by the transition functions of the reverse model to provide a new set of states representing the pre-image of the reverse model, and thus provide the post-image in the system.

Preferably, the device of this aspect further comprises a first store constructed and arranged to store bits representative of transition functions of the system, and a second store constructed and arranged to store bits representative of an estimate of transition functions of the reverse model. The logical device is constructed and arranged to store transforming the transition functions of the system into constraints on the reverse models. The parameterization device is constructed and arranged to store applying a parameterization of the constraints to the estimate of transition functions of the reverse system to form transition functions of the reverse model.

Preferably, the estimate of transition functions of the reverse model comprises previous state variables of the system.

According to yet another aspect, a device for calculating the post-image in a system includes a third means for storing bits representative of transition functions of a reverse model of the system; a fourth means for storing bits representative of a set of states of the system; and logical means for substituting the state variables of the reverse model by the transition functions of the reverse model to provide a new set of states representing the pre-image of the reverse model, and thus provide the post-image in the system.

BRIEF DESCRIPTION OF THE DRAWINGS

In the figures, like reference numerals refer to like parts.

DETAILED DESCRIPTION OF THE PREFERRED EMBODIMENT

In this example, a two bit counter is used to demonstrate a technique for modeling a reverse machine. It will be clear to one skilled in the art that if the real machine is a conventional counter which counts up, then the reverse machine will be a machine which counts down.

It will also be clear to one skilled in the art that for the simplified examples selected here, properties would normally be proved by using only a pre-image calculation. Post-image calculation could be used for example to calculate the set of reachable states, namely all states which could be reached by a particular machine. In this situation, a typical method would be to start with a set of initial states, calculate the post-image and add the states resulting in the post-image to the original set. This would then be repeated until no new states were found and the resultant would be the set of reachable states.

Although it will be clear to one skilled in the art that for a two bit counter have states (0,0), (0,1), (1,0) and (1,1) the set of reachable states would comprise the set of all these states, the following description gives an example of the construction of a reverse machine which enables the use of pre-image calculation on that reverse machine to prove this.

Figure 1:
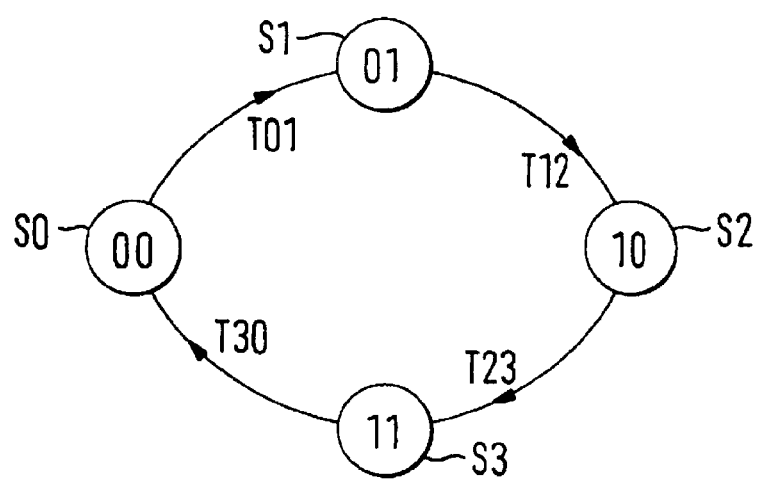
FIG. 1 shows a two bit counter as a finite state machine.

Referring to FIG. 1, a two bit counter has four states S0, S1, S2 and S3. The transition from S0 to S1 is T01 the transition from state S1 to state S2 is T12, the transition from S2 to S3 is T23 and the transition from S3 to S0 is T30.

At state S0, the bits of the counter are both equal to zero (i.e. b0=0 and b1=0, where b0 is the least significant bit and b1 is the most significant bit). In state S1, the counter has b0=1 and b1=0, in state S2 b0=0 and b1=1, and in state S3 b1=1 and b0=1

The state transition functions are formed as follows:

1. For the least significant bit, a transition from one state to the next causes the least significant bit to be inverted, i.e. b0=NOT b0.

2. For the most significant bit, this has a value of logic 1, i.e. true where the previous state is S1 or S2. For S1, b0 is true and b1 is false and for S2 b0 is false and b1 is true. Thus, b1=(NOT b0 AND b1) OR (b0 AND NOT b1).

As applied to this counter, an example of the use of the invention is to prove that only a transition from state S1 can directly result in state S2.

The invention accordingly provides a method and apparatus for synthesizing a reverse model of a finite state machine. This will be demonstrated using the finite state machine shown in FIG. 1, i.e. synthesizing a reverse counter.

To do this, it is first necessary to note that for a reverse machine, transitions would take place in the reverse direction to those shown in FIG. 1. Thus, for the reverse machine, the next state of that reverse machine is in fact the previous state of the real machine. Thus, after a transition from b0 in the reverse machine, the result is a new value equal to b0' and a transition in the reverse machine from b1 results in a new value of b1' where the notation "'" indicates the previous state of the real machine.

Applying the transition functions of the real state machine to the transitions of the reverse machine to form constraints:

b0=NOT b0' (1)

b1=(NOT b0' AND b1') OR (b0' AND NOT b1') (2)

From our British Application No 9624935.4, which is incorporated by reference as if fully set forth herein, it was shown that if a constraint is given by (NOT I AND T0) OR (I AND T1) (3)

where I is an input and neither T0 nor T1 depend on 1, then I can be generated by parameterization of this equation to provide a new input J which satisfies the relation

I=(NOT J AND NOT T0) OR (J AND T1) (4)

An equation for b0' is now generated using the constraint (1) and the parameterization technique so that:

b0'=(NOT b0" AND NOT [b0=1]) OR (b0" AND [b0=0])

=NOT b0

Substituting this equation in constraint (2) gives:

b1=(b0 AND b1') OR (NOT b0 AND NOT b1') or, equivalently: [[-]]

(b1'[[)]]AND [b0=b1]) OR (NOT b1' AND NOT [b0=b1])

By using this equation, an equation for b1' can be generated by the parameterization technique, whereby:

b1'=(NOT b1" AND [b0=b1]) OR (b1" AND [b0=b1])

thus b1'=[b0=b1]

The transitions of the reverse machine are now such that the value of b0 on the next cycle is calculated as NOT b0 and the value of b1 on the next cycle is calculated as b0=b1.

By substituting in the relationship (3) above:

b1'=(b0 AND b1) or (NOT b0 AND NOT b1).

Thus, the transition functions for the reverse machine give the following relationships: For bit 0: After a transition in the forward direction for the reverse machine, the new value of bit 0 will be true if the starting value of bit 0 were false.

In the context of the real machine, as has previously been explained, a forward transition of the reverse machine is identical to a reverse transition of the real machine. Thus, the above can be restated as:

The previous value of the bit 0 of the real machine is true if he present value of bit 0 of the real machine is false.

For bit 1: Using the bit 0 relationship above: the previous value of bit 1 for the real machine is true if the present bit 0 and the present bit 1 are both true or if the present value of bit 0 and the 1present value of bit 1 are both false.

More generally, in a model checker based on the transition relation, the formula for the calculation of the post-image of a set of states is very similar to the formula for the calculation of the pre-image (pre(X)=∃S': X[S:=S'] & R and Post(X)=(∃S: X & R) [S':=S]), where the following notation applies:

X[V:=E] substitutes the expressions E for the variables V in the predicate (X)

∃V:X existential quantification of the variables V in the predicate X.

However, in a model checker based on transition functions, the post-image formula is complicated and difficult to implement efficiently. This section will show how to provide transition functions for the reverse machine (i.e. one in which transitions go from the current state to the previous state), and therefore the pre-image of the reverse system will be the post-image of the original system.

Let the state variables and transition functions of the machine be S and T (observation functions are not considered), then the reverse system is constructed as follows. First note that S' (the next-state variables of the reverse system) correspond to the previous states of the original system. Beginning with the transitions of the reverse system being T', the transition functions of the original system are used to constrain them. Thus, for each state s and transition t, there is a constraint S=t[S:=S']. Call the set of constraints C. For each constraint, the parameterization E over the variables S', is calculated and this is substituted in the transition functions and the remaining constraints.

The parameterization is an idempotent parameterization i.e. a parameterization which after being affected, leaves the relationship entirely unaltered.

Figure 2:
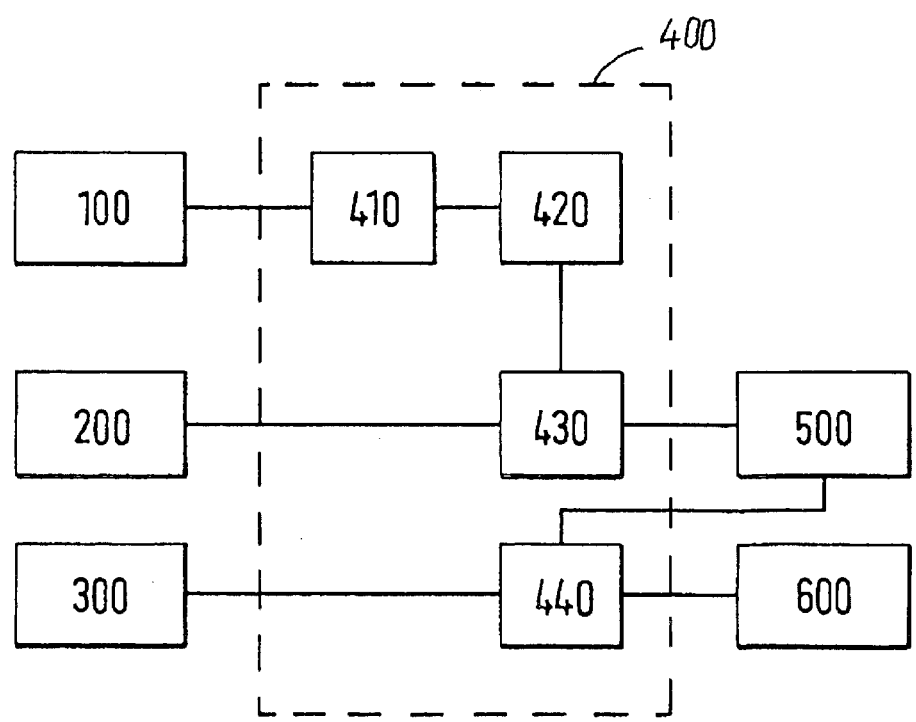
FIG. 2 shows a schematic diagram of a system for proving the properties of the hardware system.

Referring to FIG. 2, a first store (memory) 100 stores bits representative of transition functions of a system. A second store 200 stores bits representative of estimated transition function of a reverse model of said system, the estimate being derived from knowledge of the next-state variables of the reverse system, which of course correspond to the previous state variables of the original system. A third store 300 stores bits representative of the set of state variables of the system, which necessarily is also the set of state variables of the reverse model.

A processor 400 has a logical transforming device 410 which receives the transition functions of the real machine from the first store 100 and transforms the transition functions into constraints on the reverse model. The processor further has a parameterization processing device 420 for calculating for each constraint the parameterization over the variables of the reverse machine which are then applied to the estimated transition functions of the reverse machine in applying means 430. The applying means 430 provides an output to a fourth store 500 which stores the actual transition functions of the reverse model.

A processor 400 further includes a forming device 440 which receives the state variables of the real/reverse models from the third store 300 and also receives the transition functions of the reverse machine from the fourth store 500 and acts to substitute the state variables of the reverse machine with the transition functions of the reverse machine to provide a new set of states which represent the pre-image of the reverse system thus the post-image of the second system. This data is stored in fifth store 600.

Figure 3:
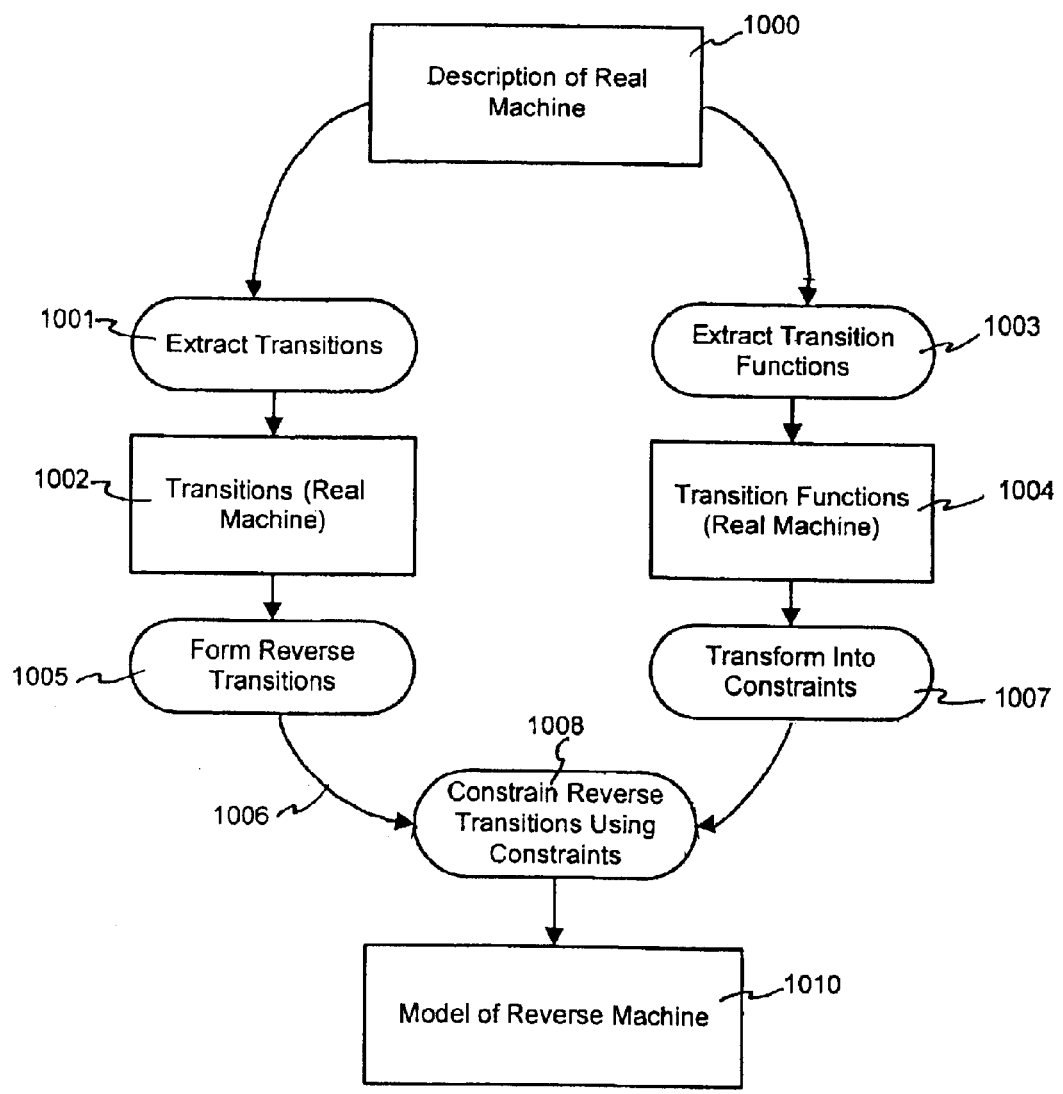
FIG. 3 shows a conceptual flow diagram of a present technique.

Referring to FIG. 3, the method of the invention, as described above, involves forming a model of the reverse machine and then applying as inputs to the model of the reverse machine, outputs of the real machine so as to determine what inputs in the real machine could give rise to those outputs. It is therefore necessary to provide an accurate model of the reverse machine and this part of the inventive method is shown in FIG. 3.

Referring to FIG. 3, a complete description of the real machine 1000 is accessed and processed to extract the state transitions 1002 using a processing engine 1001. A second processing engine 1003 also accesses the description 1000 to provide the transition functions 1004 of the real machine. A further processing stage 1005 reverses the transitions of the real machine to provide an output 1006 of reverse transitions. The transition functions in box 1004 are processed 1007 to as to transform the transition functions of the real machine into constraints and a parameterization of the constraints is applied in stage 1008 to each and all of the reverse transitions to thereby form the model of the reverse machine 1010. As reported above, by applying the outputs of the real machine as inputs to the model of the reverse machine, the inputs to the real machine can be discovered.

The described method and device has a large number of applications such as deriving properties of a control system using a model of the system or deriving properties of a hardware system using a model of the system. The described novel technique may specifically be used for testing electronic circuits, testing logic circuits, including microprocessors. In general, the described method and device can be used for testing any mechanistic system in which states occur and transitions between the states occur on a clocked or a time-dependent basis.

The above description is of preferred and exemplary embodiment(s) of the present invention only and is to enable a full understanding of the invention while not intending to limit the invention can be ascertained from the following claims.

What is claimed is:

1. A method of synthesizing a reverse model of a finite state machine, the method comprising:
    transforming a transition function of a state machine model of said finite state machine into a constraint on the reverse model, wherein the reverse model is a reverse model of the state machine model; and
    applying a parameterization of said constraint to all transitions of the reverse model.

2. The method as claimed in claim 1 wherein said finite state machine includes a logic circuits.

3. The method as claimed in claim 1 wherein said finite state machine includes a microprocessor.

4. A method of calculating a post-image in a finite state machine, the method comprising:
    forming a reverse model of said finite state machine, wherein the reverse model is a reverse model of a state machine model of the finite state machine; and
    calculating a pre-image in said reverse model, wherein the pre-image in said reverse model is equivalent to the post-image in said finite state machine.

5. The method as claimed in claim 4 wherein said finite state machine includes a logic circuits.

6. The method as claimed in claim 4 wherein said finite state machine includes a microprocessor.

7. The method of claim 4 further comprising identifying from a characterization of a model of said finite state machine, transitions of said finite state machine and reversing said transitions to form potential transitions of a reverse model.

8. The method of claim 4 and further comprising extracting from a characterization of a model of said finite state machine, transition functions of said finite state machine.

9. A device for synthesizing a reverse model of a finite state machine, the device comprising:
    a first store storing bits representative of transition functions of a state machine model of said finite state machine;
    a second store storing bits representative of an estimate of transition functions of said reverse model; and
    a processing system comprising
        a logical device for transforming said transition functions of the state machine model of said finite state machine into constraints on said reverse model, wherein the reverse model is a reverse model of the state machine model; and
        a parameterization processor for applying a parameterization of said constraints to said estimate of transition functions of said reverse model to form transition functions of said reverse model.

10. A device as claimed in claim 9 wherein said estimate of transition functions of said reverse model comprises previous state variables of said finite state machine.

11. The device as claimed in claim 9 wherein said finite state machine includes a logic circuits.

12. The device as claimed in claim 9 wherein said finite state machine includes a microprocessor.

13. A device for calculating a post-image in a finite state machine comprising:

a third store storing bits representative of transition functions of a reverse model of said finite state machine;

a fourth store storing bits representative of a set of states of a state machine model of said finite state machine; and a forming device substituting the state variables of the reverse model by the transition functions of the reverse model to provide a new set of states representing the pre-image of said reverse model, and thus provide the post-image in said finite state machine.

14. A device as claimed in claim 13 further comprising a first store storing bits representative of transition functions of said finite state machine;

a second store storing bits representative of an estimate of transition functions of said reverse model;

a logical device for transforming said transition functions of said finite state machine into constraints on said reverse models; and a parameterization processor for applying a parameterization of said constraints to said estimate of transition functions of the reverse model to form transition functions of said reverse model.

15. A device as claimed in claim 14 wherein said estimate of transition functions of said reverse model comprises previous state variables of said finite state machine.

16. The device as claimed in claim 13 wherein said finite state machine includes a logic circuits.

17. The device as claimed in claim 13 wherein said finite state machine includes a microprocessor.

* * * * *

UNITED STATES PATENT AND TRADEMARK OFFICE
CERTIFICATE OF CORRECTION

PATENT NO. : 6,816,821 B1
DATED : November 9, 2004
INVENTOR(S) : Geoff Barret

It is certified that error appears in the above-identified patent and that said Letters Patent is hereby corrected as shown below:

Column 4,
Line 7, should read -- where I is an input and neither T0 nor T1 depend on I, --

Column 5,
Line 7, should read -- of the reverse system thus the post-image of the real --

Column 6,
Line 7, should read -- limit the invention. The scope of the invention can be ascertained form the following --

Signed and Sealed this

Eighth Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,816,821 B1
DATED : November 9, 2004
INVENTOR(S) : Geoff Barret

It is certified that error appears in the above-identified patent and that said Letters Patent is hereby corrected as shown below:

<u>Column 4,</u>
Line 7, should read -- where I is an input and neither T0 nor T1 depend on I, --.

<u>Column 5,</u>
Line 39, should read -- of the reverse system thus the post-image of the real --.

<u>Column 6,</u>
Line 7, should read -- limit the invention. The scope of the invention can be ascertained form the following --.

This certificate supersedes Certificate of Correction issued March 8, 2005.

Signed and Sealed this

Fourth Day of October, 2005

JON W. DUDAS
*Director of the United States Patent and Trademark Office*